United States Patent
Sugiura

(10) Patent No.: US 7,741,856 B2
(45) Date of Patent: Jun. 22, 2010

(54) IMMUNITY TEST SYSTEM

(75) Inventor: Toshihiro Sugiura, Nisshin (JP)

(73) Assignee: Masprodenkoh KabushikiKaisha, Aichi-Ken (JP)

( * ) Notice: Subject to any disclaimer, the term of this patent is extended or adjusted under 35 U.S.C. 154(b) by 0 days.

(21) Appl. No.: 11/441,749

(22) Filed: May 26, 2006

(65) Prior Publication Data

US 2006/0267597 A1 Nov. 30, 2006

(30) Foreign Application Priority Data

May 27, 2005 (JP) ............................. 2005-156078

(51) Int. Cl.
*G01R 27/28* (2006.01)
(52) U.S. Cl. ....................... 324/627; 324/637
(58) Field of Classification Search ................. 324/627, 324/628
See application file for complete search history.

(56) References Cited

U.S. PATENT DOCUMENTS

| | | | | |
|---|---|---|---|---|
| 5,237,283 A | * | 8/1993 | Carbonini | 324/627 |
| 5,302,960 A | * | 4/1994 | Boers | 342/372 |
| 5,514,971 A | * | 5/1996 | Hankui et al. | 324/639 |
| 5,552,715 A | * | 9/1996 | Rogers | 324/627 |
| 5,844,413 A | * | 12/1998 | Hansen et al. | 324/627 |
| 5,920,064 A | * | 7/1999 | Rogers | 250/214 R |
| 5,923,295 A | * | 7/1999 | Nakano et al. | 343/700 MS |
| 6,295,032 B1 | * | 9/2001 | Podgorski | 343/703 |

FOREIGN PATENT DOCUMENTS

JP 2003-121485 4/2003

OTHER PUBLICATIONS

Takahiro, Machine Translation of JP 2003-121485A, JPO translation services, Jan. 1, 2008.*
Magid, Leonard, Electromagnetic Fields, Energy and Waves, J. Wiley and Sons, 1972, p. 650-657.*

* cited by examiner

*Primary Examiner*—Thomas Valone
(74) *Attorney, Agent, or Firm*—Davis & Bujold, P.L.L.C.

(57) ABSTRACT

In an immunity test system of the present invention, a boundary point detection device changes a signal level of a transmission signal input to an antenna through a level adjusting device while monitoring an operation of an electronic equipment, and thereby detects a signal level of the transmission signal at a boundary point, at which the electronic equipment is changed from a normal operation state to an abnormal operation state, or vice versa, due to the test wave; and a test result storing device calculates an electric field strength of the test wave at the boundary point by using conversion data based on the signal level of the transmission signal at the boundary point detected by the boundary point detection device, and stores in a storage device a calculation result of the electric field strength as well as a test condition used for obtaining the electric field strength.

7 Claims, 9 Drawing Sheets

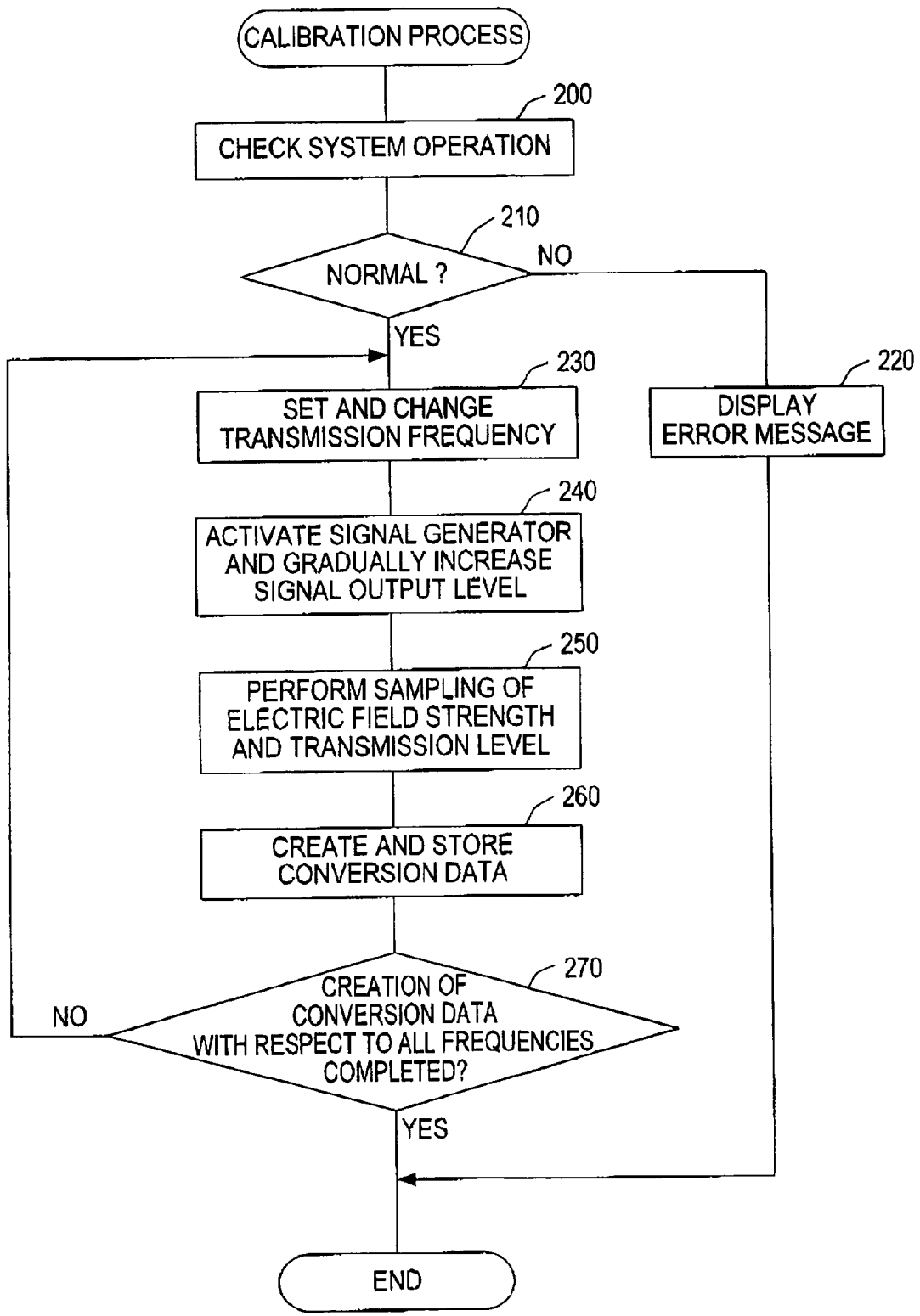

IMMUNITY TEST SYSTEM

BACKGROUND OF THE INVENTION (i) Field of the Invention

The present invention relates to an immunity test system for use in conducting an immunity test, i.e., an interference elimination ability test, to determine immunity of electronic equipment by using an interference wave.

(ii) Background Art

There has been a known immunity test to determine immunity of electronic equipment by using an interference wave, as one of EMC (Electro-Magnetic Compatibility) tests for evaluating electromagnetic compatibility of electronic equipment.

The immunity test is a test to determine whether or not electronic equipment as a test object (hereinafter also referred to as "test equipment") can operate normally when irradiated with an interference wave. The frequency and the strength of the interference wave to be irradiated to the test equipment in the test are defined by international standards by, for example, the International Electrotechnical Commission (IEC), or by standards by a variety of organizations.

Accordingly, a system for conducting an immunity test is generally provided with a horn antenna having desired directional characteristics and an oscillator that inputs a transmission signal to the horn antenna to cause the horn antenna to emit a test wave as an interference wave. Before conducting a test, a signal level of a transmission signal to be input to the horn antenna by the oscillator is adjusted through an amplifier, an attenuator or the like, such that a test wave having a specified strength (for example, 600V/m) may be irradiated to test equipment. An example of such a system is disclosed in Publication of Unexanmined Japanese Patent Application No. 2003-121485.

SUMMARY OF THE INVENTION

Such a conventional immunity test system, however, does not allow evaluation on what level of immunity against an interference wave test equipment has, while allowing determination on whether or not the test equipment has passed a specific immunity test. To make an evaluation, an operator of the test system is required to observe the operating state of the test equipment, manually change an input level of the transmission signal to the horn antenna, and measure an electric field strength of the test wave which is irradiated to the test equipment by the horn antenna when an abnormal operation occurs in the test equipment.

Accordingly, evaluation of immunity of test equipment against an interference wave usually takes time and trouble. This leads to a problem, for example, that to offer electronic equipment having a sufficient immunity against an interference wave, an increased design time and thus an increased cost of the electronic equipment are required.

The present invention has been made in view of the problem mentioned above, and it is an object of the invention to provide an immunity test system to determine immunity of electronic equipment against an interference wave, in which it is possible to obtain a test result that allows evaluation on what level of immunity against an interference wave the electronic equipment has.

In one aspect of the present invention, there is provided an immunity test system for determining an immunity of a piece of electronic equipment as a test object by irradiating the electronic equipment with a test wave. The immunity test system comprises an antenna, a signal generator, a level adjusting device, a boundary point detection device, and a test result storing device.

The antenna emits the test wave toward the electronic equipment. The signal generator generates a transmission signal to cause the antenna to emit the test wave. The level adjusting device adjusts a signal level of the transmission signal input from the signal generator to the antenna. The boundary point detection device changes the signal level of the transmission signal input to the antenna through the level adjusting device while monitoring an operation of the electronic equipment, and thereby detects a signal level of the transmission signal at a boundary point, at which the electronic equipment is changed from a normal operation state to an abnormal operation state or from an abnormal operation state to a normal operation state due to the test wave. The test result storing device calculates an electric field strength of the test wave irradiated to the electronic equipment at the boundary point by using a predetermined conversion data based on the signal level of the transmission signal at the boundary point detected by the boundary point detection device, and stores in a storage device a calculation result of the electric field strength as well as a test condition used for obtaining the electric field strength.

According to the immunity test system configured as above, the electric field strength of the test wave when the electronic equipment starts to operate abnormally due to an influence of the test wave emitted from the antenna is automatically stored, as a test result, in the storage device. A user may make the immunity test system execute a sequence of test operation by the boundary point detection device and the test result storing device while changing test conditions, including a frequency of the test wave emitted from the antenna (in other word, a transmission signal input to the antenna from the signal generator through the level adjusting device). By subsequently reading test results with respect to each of the test conditions stored in the storage device, the user may evaluate the immunity of the electronic equipment when the test wave is emitted under each of the test conditions.

Accordingly, the immunity test system of the present invention will allow evaluation of the immunity of the electronic equipment as the test object in an extremely simple manner and in a short time. It is, therefore, possible to reduce a design time for designing electronic equipment having a sufficient immunity against interference waves thereby to achieve a reduced cost of the electronic equipment.

In another aspect of the present invention, the signal generator in the immunity test system may be adapted such that the frequency of the transmission signal is capable of being set from an outside source. Also, a plurality of test conditions may be set such that at least one of the plurality of test conditions includes a frequency which is different from a frequency included in another at least one of the plurality of test conditions.

In the another aspect of the present invention, the immunity test system may further comprise a test condition changing device (a first condition changing device) that sets the frequency of the transmission signal generated by the signal generator to the frequency included in the at least one of the plurality of test conditions, changes the frequency of the transmission signal generated by the signal generator to the frequency included in the another at least one of the plurality of test conditions when a sequence of test operation by the boundary point detection device and the test result storing device under the at least one of the plurality of test conditions is completed, thereby to allow execution of the sequence of test operation with respect to each of all frequencies set to be included in the plurality of test conditions.

According to the immunity test system configured as above, it may be possible to automatically measure the electric field strength of the test wave when the electronic equipment starts to operate abnormally while changing the frequency of the test wave with respect to each frequency. Therefore, evaluation of the immunity of the electronic equipment with respect to each frequency may be performed in a shorter time.

In a further aspect of the present invention, a plurality of test conditions may be set such that at least one of the plurality of test conditions includes a polarization angle which is different from a polarization angle included in another at least one of the plurality of test conditions.

In the further aspect of the present invention, the immunity test system may further comprise a polarization plane adjusting device and a test condition changing device (a second test condition changing device). The polarization plane adjusting device changes a polarization angle of the test wave emitted from the antenna at least between a horizontal direction and a vertical direction. The test condition changing device that sets the polarization angle of the test wave emitted by the antenna through the polarization plane adjusting device to the polarization angle included in the at least one of the plurality of test conditions, changes the polarization angle of the test wave emitted by the antenna to the polarization angle included in the another at least one of the plurality of test conditions when a sequence of test operation by the boundary point detection device and the test result storing device under the at least one of the plurality of test conditions is completed, thereby to allow execution of the sequence of test operation with respect to each of all polarization angles set to be included in the plurality of test conditions.

According to the immunity test system configured as above, it may be possible to automatically measure the electric field strength of the test wave when the electronic equipment starts to operate abnormally while changing the angle of the polarization plane of the test wave with respect to each polarization angle. Therefore, evaluation of the immunity of the electronic equipment with respect to each polarization angle may be performed in a shorter time.

In a conventional immunity test with respect to a polarization plane of a test wave, two types of radio waves, specifically a horizontally polarized wave and a vertically polarized wave, are usually used, and an angle of the polarization plane is changed by manually rotating the antenna. According to the immunity test system configured as above, the polarization plane adjusting device may change the angle of the polarization plane of the test wave emitted from the antenna at least between a horizontal direction and a vertical direction. It may also be possible to set the polarization angle of the test wave to an optional angle (any angle) in addition to the horizontal and the vertical direction by appropriately specifying test conditions and evaluate the immunity of the electronic equipment against interference waves. This will allow a broader range of evaluation.

In a yet another aspect of the present invention, the immunity test system may further comprise a display device that displays a test result stored in the storage device by the test result storing device.

According to the immunity test system configured as above, a user may evaluate the immunity of the electronic equipment against interference waves while viewing an image displayed on the display device. This will lead to an improved usability of the immunity test system.

In a yet further aspect of the present invention, the immunity test system may further comprise a test condition input device to register at least one test condition from an outside source.

According to the immunity test system configured as above, test conditions, such as a frequency and a polarization angle of a test wave to be emitted from the antenna, may be registered through the test condition input device. Therefore, a user may evaluate the immunity of the electronic equipment against interference waves under optional test conditions. This will allow a broader application of the immunity test system.

In another aspect of the present invention, the immunity test system may further comprise a device that creates conversion data to be used by the test result storing device for calculating an electric field strength of a test wave before determining the immunity of the electronic equipment. The device may include an electric field strength measuring device and a conversion data creation device.

The electric field strength measuring device may be disposed at a placement position, at which the electronic equipment as an object of determining the immunity thereof is placed, to measure an electric field strength of the test wave emitted from the antenna.

The conversion data creation device may read the electric field strength of the test wave obtained through the electric field strength measuring device while changing the signal level of the transmission signal input to the antenna through the level adjusting device, thereby to create data indicating a correspondence between the signal level input to the antenna and the electric field strength of the test wave at the placement position of the electronic equipment and sets the created data as the conversion data.

According to the immunity test system configured as above, it may be possible to predetermine the conversion data to be used for calculating the electric field strength of the test wave actually irradiated to the electronic equipment based on the signal level of the transmission signal to the antenna in accordance with actual test conditions before placing the electronic equipment and actually starting an immunity test thereof. This will lead to an increased accuracy in calculation of the electric field strength by the test result storing device, and thus to an increased test accuracy in the immunity test system.

BRIEF DESCRIPTION OF THE DRAWINGS

A preferred embodiment of the present invention will be described hereinafter with reference to the drawings, in which:

FIG. 8 is a flowchart showing a calibration process to create conversion data;

DETAILED DESCRIPTION OF THE PREFERRED EMBODIMENT

Figure 1:
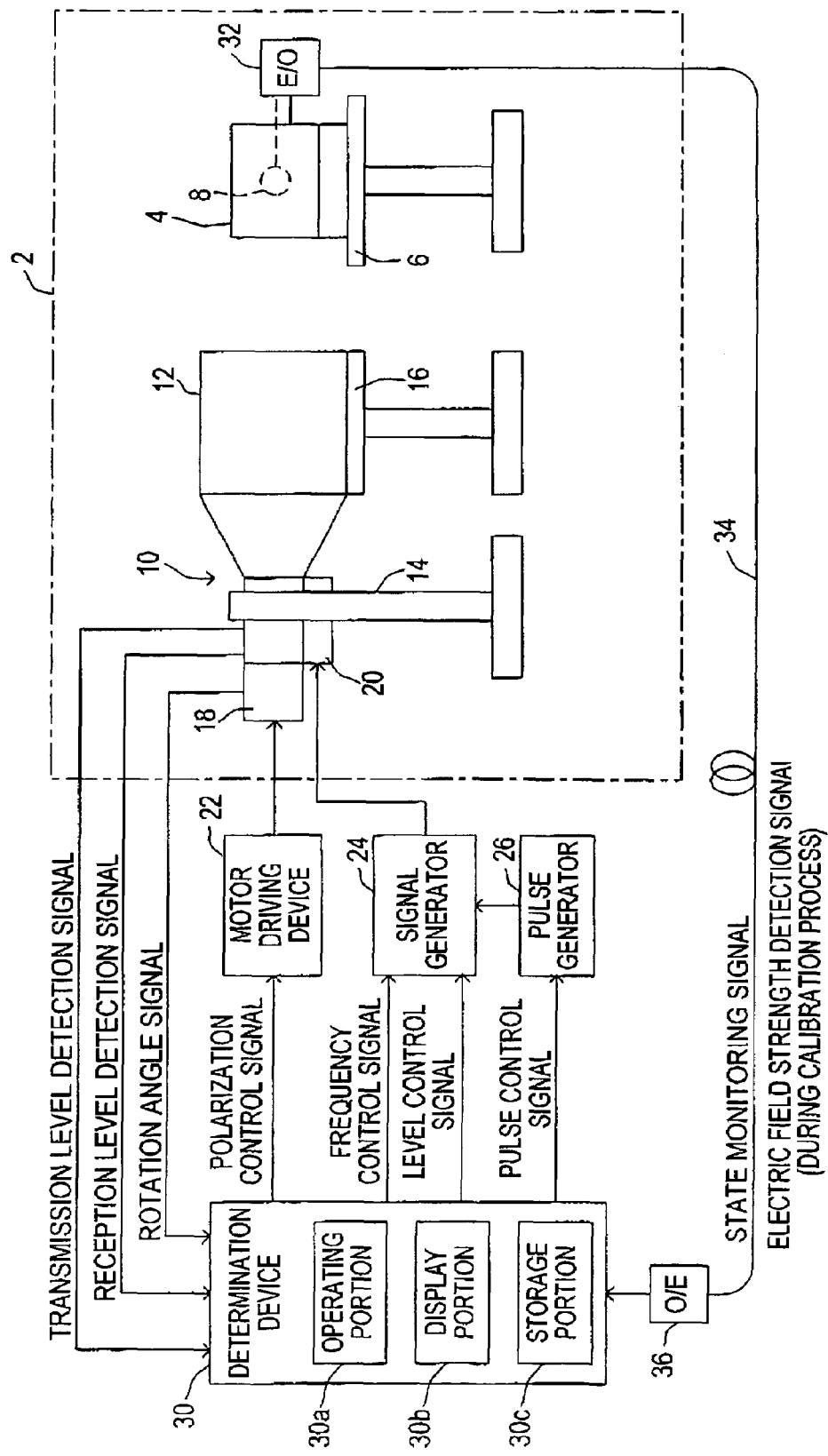
FIG. 1 is diagram view showing a configuration of an entire immunity test system in the embodiment.

As shown in FIG. 1, an immunity test system of the present embodiment is designed to be used to conduct an immunity test, in which a test wave as an interference wave is irradiated to test equipment 4 placed on a placement table 6, thereby to determine immunity of the test equipment 4 against the interference wave. The immunity test system includes a horn antenna 10 to emit the test wave and a waveguide 12 to efficiently guide the test wave irradiated from the horn antenna 10 to the test equipment 4. As shown, the waveguide is open at one end and the test wave, during operation, is emitted toward the test electronic equipment 4 which is disposed outside of and spaced from the open end of the waveguide.

The horn antenna 10 and the waveguide 12, as well as the placement table 6 for the test equipment 4, are placed in a radio anechoic chamber 2. The horn antenna 10 is fixed to a support 14 such that an opening face of the horn antenna 10 is directed to the test equipment 4 on the placement table 6. The waveguide 12 is disposed between the horn antenna 10 and the test equipment 4 through a support table 16.

The horn antenna 10 is provided integrally with an amplifier 20 and a motor 18. The amplifier 20 amplifies a transmission signal to cause emission of the test wave from the horn antenna 10 and inputs the amplified transmission signal to the horn antenna 10. The motor 18 continuously adjusts an angle of a polarization plane of the test wave emitted from the horn antenna 10 from a horizontal direction to a vertical direction.

Figure 2:
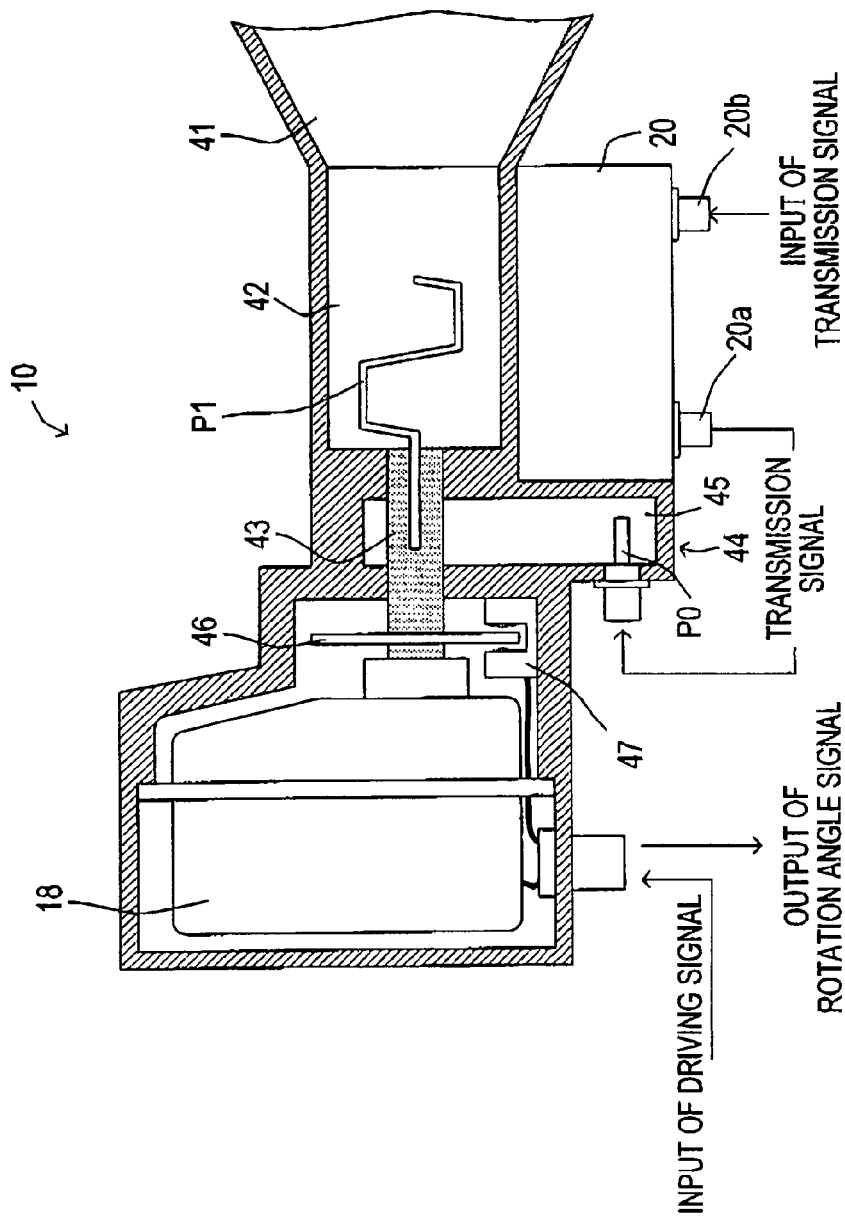
FIG. 2 is a cross-sectional view showing an internal structure of a horn antenna.

Specifically, as shown in FIG. 2, the horn antenna 10 in the present embodiment includes a horn 41 having a circular cone shape or a pyramid shape, a waveguide 42 extending from a rear end of the horn 41, a probe P1 and a coaxial waveguide converter 44. The probe P1 is fixed to a rear end of the waveguide 42 in a rotatable manner around a central axis of the waveguide 42 through a rotating shaft 43. The coaxial waveguide converter 44 supplies a transmission signal to the probe P1. The amplifier 20 housed in a metal housing is attached to an external wall of the waveguide 42.

The probe P1 is bent into a square-wave shape along the central axis of the waveguide 42. By rotating the probe P1 around the central axis of the waveguide 42 through the rotating shaft 43, the polarization angle of the test wave emitted from the horn antenna 10 can be adjusted. The coaxial waveguide converter 44 includes a probe P0 that receives the transmission signal provided from an output terminal 20a of the amplifier 20 and feeds power to the probe P1, and a waveguide 45 that forms a power feed path from the probe P0 to the probe P1 and connects the probe P0 and the probe P1.

The waveguide 45 is penetrated by the rotating shaft 43, which supports a rear end of the probe P1, in a backward direction. The motor 18 connected to the rotating shaft 43 so as to rotate the rotating shaft 43 is assembled on a rear side of the waveguide 45.

A step motor or a servo motor is employed as the motor 18 which is able to be stopped at a desired rotation angle. A rotation plate 46 having a slit for rotation angle detection is fixed to an output shaft of the motor 18 (and thus the rotating shaft 43). A rotation sensor 47 that detects the slit and generates a rotation angle signal indicating a rotation angle of the motor (and thus a polarization angle of the test wave emitted from the horn antenna 10).

Further, a motor driving device 22, a signal generator 24, a pulse generator 26 and a determination device 30 are provided outside the radio anechoic chamber 2. The motor driving device 22 is used for driving the motor 18 to adjust the polarization angle of the test wave. The signal generator 24 generates the transmission signal to cause the horn antenna 10 to emit the test wave. The pulse generator 26 generates a pulse signal to perform pulse width modulation of the transmission signal during an immunity test.

The determination device 30 controls these devices or components to cause the horn antenna 10 to transmit the test wave according to previously prescribed test conditions. The determination device 30 includes a computer system (for example, a personal computer) provided with an operating portion 30a, a display portion 30b, a storage portion 30c, and others. The operating portion 30a, including a keyboard, a mouse, and the like, is used for manual operation by a user. The display portion 30b, including a CRT, an LCD, or the like, is to indicate information such as a test result. The storage portion 30c, including a hard disk, a flash memory, or the like, stores information such as a test result.

The determination device 30 does not simply cause the horn antenna 10 to emit a test wave during an immunity test, the determination device 30 monitors an operating state of the test equipment 4 placed on the placement table 6. The determination device 30 monitors the operating state of the test equipment 4 based on a signal for state monitoring (a state monitoring signal) output from the test equipment 4. The determination device 30 then changes properties (output level, frequency, polarization angle, etc.) of the test wave emitted from the horn antenna 10 in accordance with specified test conditions, and thereby determines the immunity of the test equipment 4 under the respective test conditions. The determination device 30 also stores determination results in the storage portion 30c and indicates the determination results on the display portion 30b.

The state monitoring signal may be any type of signal which indicates the operating state of the test equipment 4. For example, when the test equipment 4 is electronic equipment with an embedded microcomputer, a watchdog signal periodically output from the microcomputer may be used as the state monitoring signal. When the test equipment 4 is audio equipment, an audio signal output during the operation of the audio equipment may be used as the state monitoring signal.

In the present embodiment, the state monitoring signal is converted into an optical signal and is transmitted. In the preferred embodiment, an optical signal is used in order to prevent deterioration of the state monitoring signal due to an influence of noises on a transmission path from the radio anechoic chamber 2 to the determination device 30. One skilled in the art can appreciate that the type of signal used can change as the specifications for the present invention change that may reduce or eliminate potential noise issues. Specifically, an electric-optic converter (an E/O converter) 32 for converting the state monitoring signal to an optical signal is provided in the radio anechoic chamber 2, while an optoelectric converter (an O/E converter) 36 on a side of the determination device 30. By connecting these converters through an optical fiber 34, the state monitoring signal output from the test equipment 4 is converted into an optical signal and is transmitted to the determination device 30.

Figure 3:
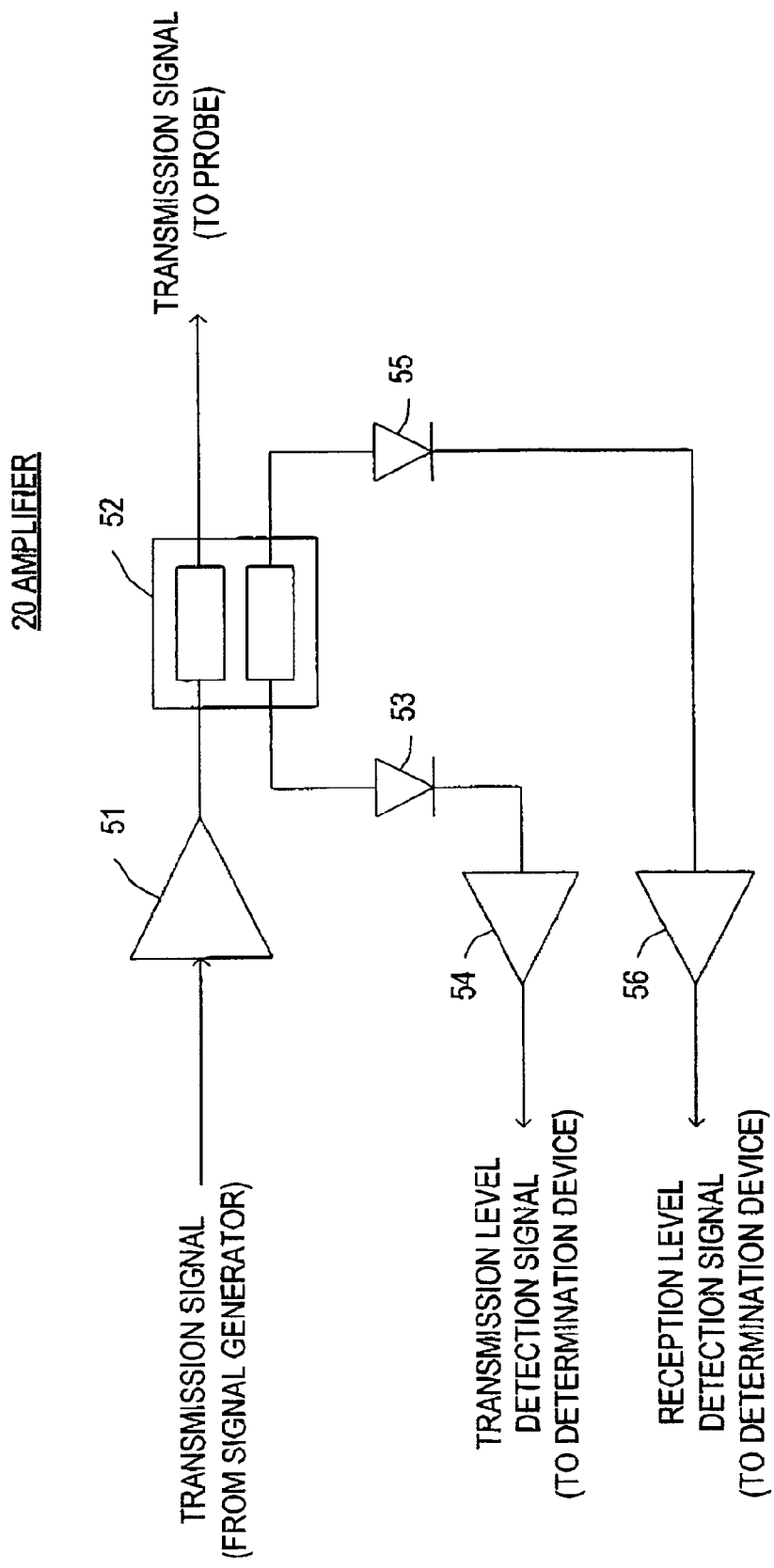
FIG. 3 is an explanatory view showing a configuration of an amplifier.
Figure 4:
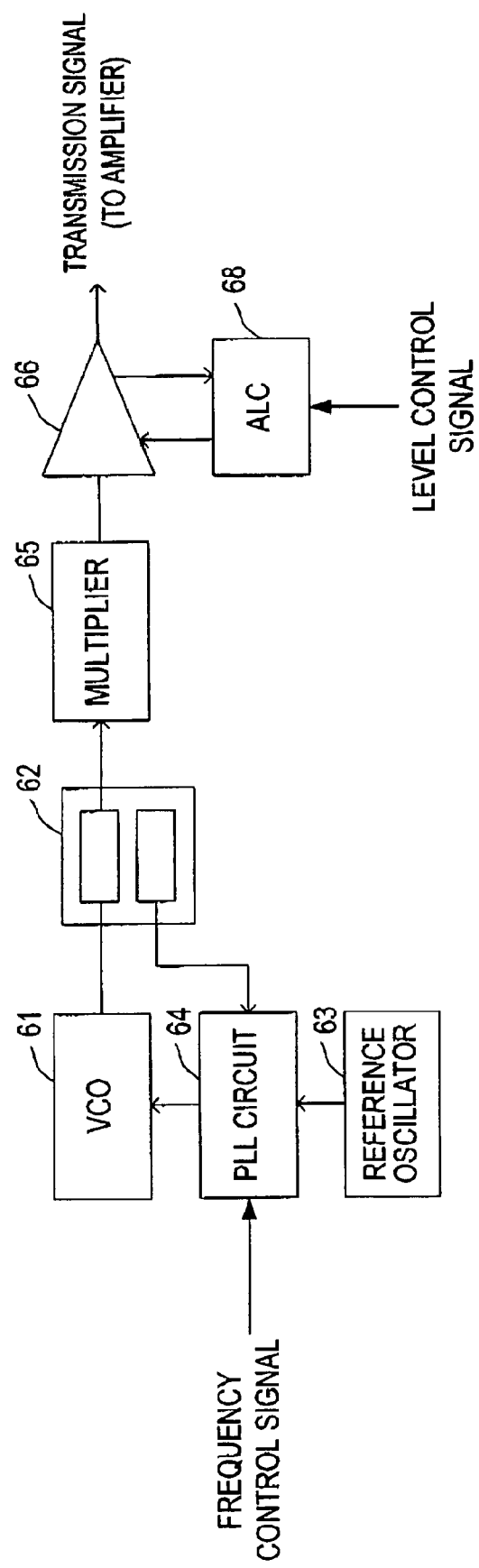
FIG. 4 is an explanatory view showing a configuration of a signal generator.

The amplifier 20 is provided for amplifying the transmission signal output from the signal generator 24 and input through an input terminal 20b and inputting the amplified signal to the horn antenna 10, specifically to the probe P0 shown in FIG. 2. As shown in FIG. 3, the amplifier 20 includes an amplifier circuit 51 for amplifying the transmission signal and a directional coupler 52 for extracting portions of the transmission signal amplified by the amplifier circuit 51 and a reception signal input to the amplifier 20 from the horn antenna 10.

The transmission signal and the reception signal extracted by the directional coupler 52 are detected by wave detectors 53, 55, respectively, and then are converted into level detection signals indicating signal levels of the respective signals. The converted level detection signals (i.e., a transmission level detection signal and a reception level detection signal) are amplified by amplifier circuits 54, 56 having specified gains, and then are transmitted to the determination device 30.

The determination device 30 receives the transmission level detection signal transmitted from the amplifier circuit 54 after performing A/D conversion, and thereby detects a signal level of a transmission signal to be output to the horn antenna 10. By controlling the signal generator 24 based on the detected signal level, the determination device 30 controls the signal level of the transmission signal to be output to the horn antenna 10 (and thus an electric field strength of the test wave to be irradiated to the test equipment 4).

The determination device 30 receives the reception level detection signal transmitted from the amplifier circuit 56 after performing A/D conversion, and thereby detects a signal level of a reflected wave caused by the test wave being emitted by the horn antenna 10 and being reflected by the test equipment 4 and others. When the detected signal level is higher than a predetermined maximum level, the determination device 30 stops or suppresses the amplifying operation of the amplifier 20 (and thus transmission of the test wave from the horn antenna 10), in order to protect the amplifier 20 from the reflected wave.

The determination device 30 also receives an input of a rotation angle signal from the rotation sensor 47 associated with the motor 18 and detects an inclination of the polarization plane (a polarization angle) of the test wave emitted from the horn antenna 10. During an immunity test, the determination device 30 controls the rotation angle of the motor 18 through the motor driving device 22 such that the polarization angle is an appropriate angle corresponding to the current test condition.

The signal generator 24 includes electronic circuitry, namely, a voltage controlled, frequency-variable oscillation circuit (VCO) 61, a reference oscillator 63, a directional coupler 62, a PLL circuit 64, a multiplier 65 and an amplifier circuit 66, for setting the frequency of the transmission signal.

An oscillation frequency of the VOC 61 can be controlled by a controlled voltage. The reference oscillator 63 generates a reference signal having a specified frequency by using quartz or the like. The PLL circuit 64 receives part of a high-frequency signal output from the VCO 61 through the directional coupler 62, and performs frequency dividing or multiplying of the high-frequency signal and the reference signal generated by the reference oscillator 63 for phase comparison, in accordance with a frequency control signal input from an outside source. The PLL circuit 64 then controls the oscillation frequency of the VOC 61 based on the phase comparison. The multiplier 65 multiplies the frequency of the high-frequency signal output from the VOC 61 to generate a transmission signal. The amplifier circuit 66 amplifies the transmission signal generated by the multiplier 65 and outputs the amplified transmission signal to the amplifier 20.

The frequency control signal is input from the determination device 30 to the PLL circuit 64 in the signal generator 24. When an immunity test is conducted, the determination device 30 changes the frequency control signal, and thereby changes the frequency of the high-frequency signal which is output from the VOC 61 (and thus the frequency of the transmission signal output from the signal generator 24 to the amplifier 20). The determination device 30 determines the immunity of the test equipment 4 with respect to each of the changed frequencies.

The amplifier circuit 66 in the signal generator 24 is provided with an automatic level control circuit (an ALC circuit) 68 for controlling an output level of the transmission signal from the amplifier circuit 66 by controlling a gain of the amplifier circuit 66. When an immunity test is conducted, the determination device 30 outputs a level control signal to the ALC circuit 68, and thereby controls a signal level of a transmission signal output from the signal generator 24 to the horn antenna 10 through the amplifier 20 (and thus controls a transmission level of the test wave emitted from the horn antenna 10 toward the test equipment 4).

Figure 5:
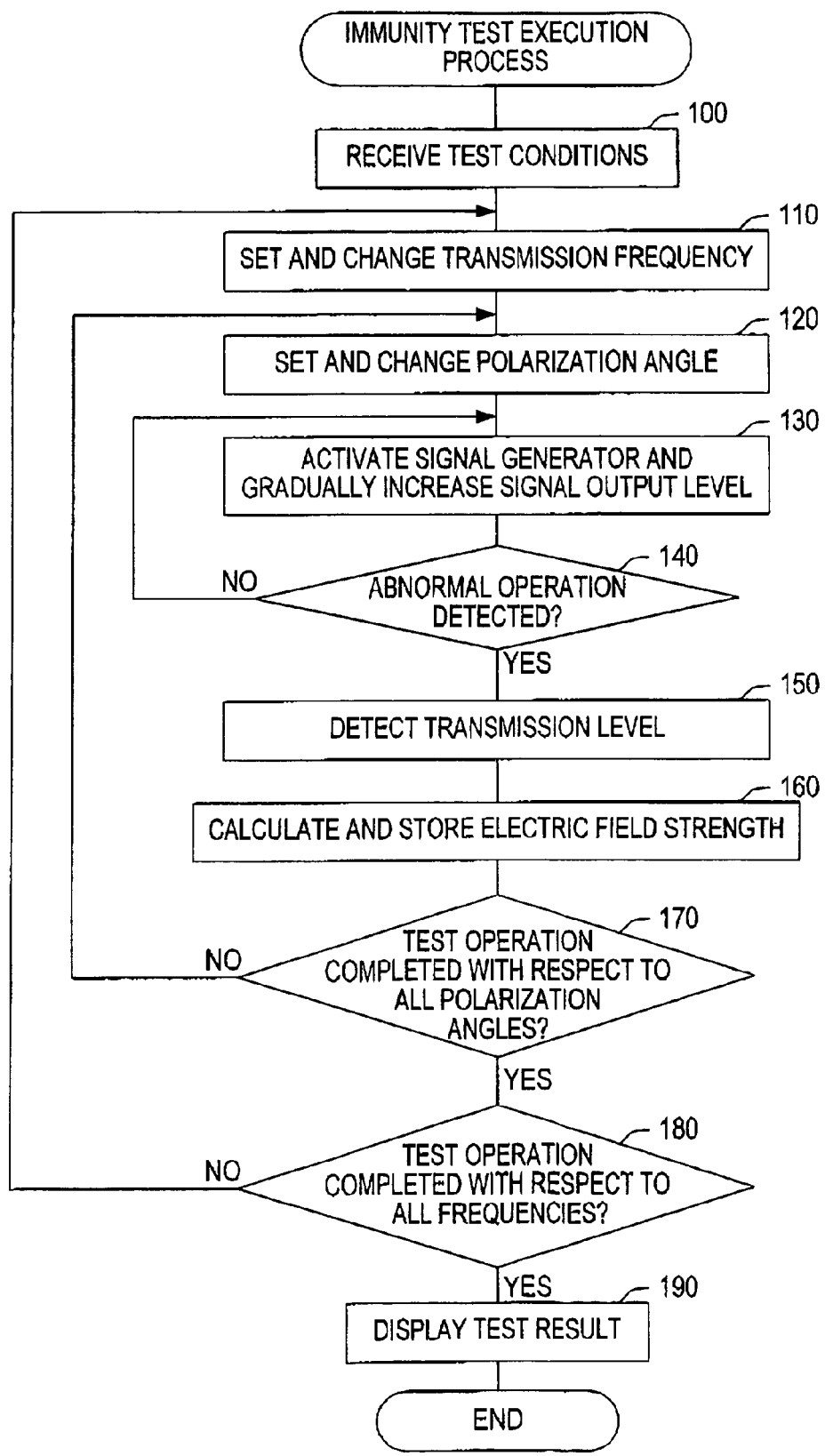
FIG. 5 is a flowchart showing an immunity test execution process.

FIG. 5 is a flowchart showing a control process (an immunity test execution process) executed by the determination device 30 during an immunity test.

This is a process executed by the determination device 30 when a user inputs a start command of an immunity test by operating the operating portion 30a. It is preferable that prior to the following description the user performs a preparation for the immunity test with respect to an intended test equipment 4, such as placing the test equipment 4 on the placement table 6 and connecting the E/O converter 32 to the test equipment 4, before inputting the start command.

As shown in FIG. 5, when the present immunity test execution process is started, the determination device 30 executes a test condition reception process in S100. In S100, the determination device 30 displays a test condition setting screen on the display portion 30b and receives test conditions input by the user through the setting screen.

Specifically, the test conditions which can be used in the present embodiment include, for example, a frequency of a test wave used in the immunity test, an angle of a polarization plane of the test wave (a polarization angle), a determination strength which indicates an electric field strength for determining acceptance or rejection of the test equipment 4 in the immunity test, a generating cycle and a duty ratio of a pulse signal when a pulse width of a transmission signal is modulated. With respect to the frequency and the polarization angle of the test wave, a range of test and an amount of change at one time within the range can also be used.

In S100, the test condition setting screen showing test conditions, including a current set value of such a parameter as above, is displayed to receive in sequence whether or not each test condition is to be changed and a changed value, in case of change. Thus, test conditions required to execute the subsequent processings of the immunity test are specified.

Then, the present process proceeds to S110. In S110, a frequency control signal is output to the signal generator 24 thereby to set a frequency (a transmission frequency) of a transmission signal (and thus a test wave to be emitted from the horn antenna 10) to a frequency in accordance with the test conditions received in S100.

In the case where a frequency range and an amount of frequency change are set as the test conditions, a lowest (or a highest) frequency within the frequency range is set in the processing in S110 for the first time immediately after the present immunity test execution process is started. Subsequently, each time the processing in S110 is executed, the previously set frequency is increased (or decreased) by the amount of frequency change set as the test condition, and the increased (or decreased) frequency is newly set.

In S120, a polarization control signal is output to the motor driving device 22 to rotate the motor 18 such that the angle of the polarization plane of the test wave emitted from the horn antenna 10 is set to a polarization angle in accordance with the test conditions received in S100.

In the case where an angle range of the polarization plane (a polarization angle range) of the test wave and an amount of polarization angle change are set as the test conditions, a most horizontal (or a most vertical) polarization angle within the polarization angle range is set in the processing in S120 for the first time immediately after the present immunity test execution process is started. Subsequently, each time the processing in S120 is executed, the previously set polarization angle is changed in a vertical (or a horizontal) direction by the amount of polarization angle change set as the test condition, and thus the changed polarization angle is newly set.

After the frequency and the polarization angle of the test wave are set in S110 and S120 as above, the present process proceeds to S130. In S130, the signal generator 24 is activated. A level control signal is provided to the ALC circuit 68 in the signal generator 24, which causes the signal generator 24 to output a transmission signal. An output level of the transmission signal is gradually increased.

In S140, it is determined whether or not the test equipment 4 has changed from a normal operation state to an abnormal operation state based on a state monitoring signal input through the O/E converter 36.

When it is determined that the test equipment 4 has not changed to the abnormal operation state, the present process returns to S130. Then, the output level of the transmission signal from the signal generator 24 is increased until it is determined that the test equipment 4 has started to operate abnormally.

When the signal generator 24 is activated to emit the test wave from the horn antenna 10 in S130, the determination device 30 controls the generating cycle and the duty ratio of a pulse signal generated by the pulse generator 26 in accordance with the test conditions so as to modulate a pulse width of the transmission signal (and thus test wave) in accordance with the test conditions.

Also as described above, the determination device 30 monitors a reception level detection signal output from the amplifier 20 while the horn antenna 10 emits the test wave. When a signal level of the reception signal input from the horn antenna 10 to the amplifier 20 exceeds a maximum level, the determination device 30 stops or suppresses the amplifying operation of the amplifier 20 to protect the amplifier 20 from a reflected wave.

When it is determined that the test equipment 4 has changed to the abnormal operation state in S140, the present process proceeds to S150. In S150, a transmission level detection signal is read from the amplifier 20 to detect a signal level of the transmission signal at a boundary point at which the test equipment 4 changes from the normal operation state to the abnormal operation state.

Figure 6:
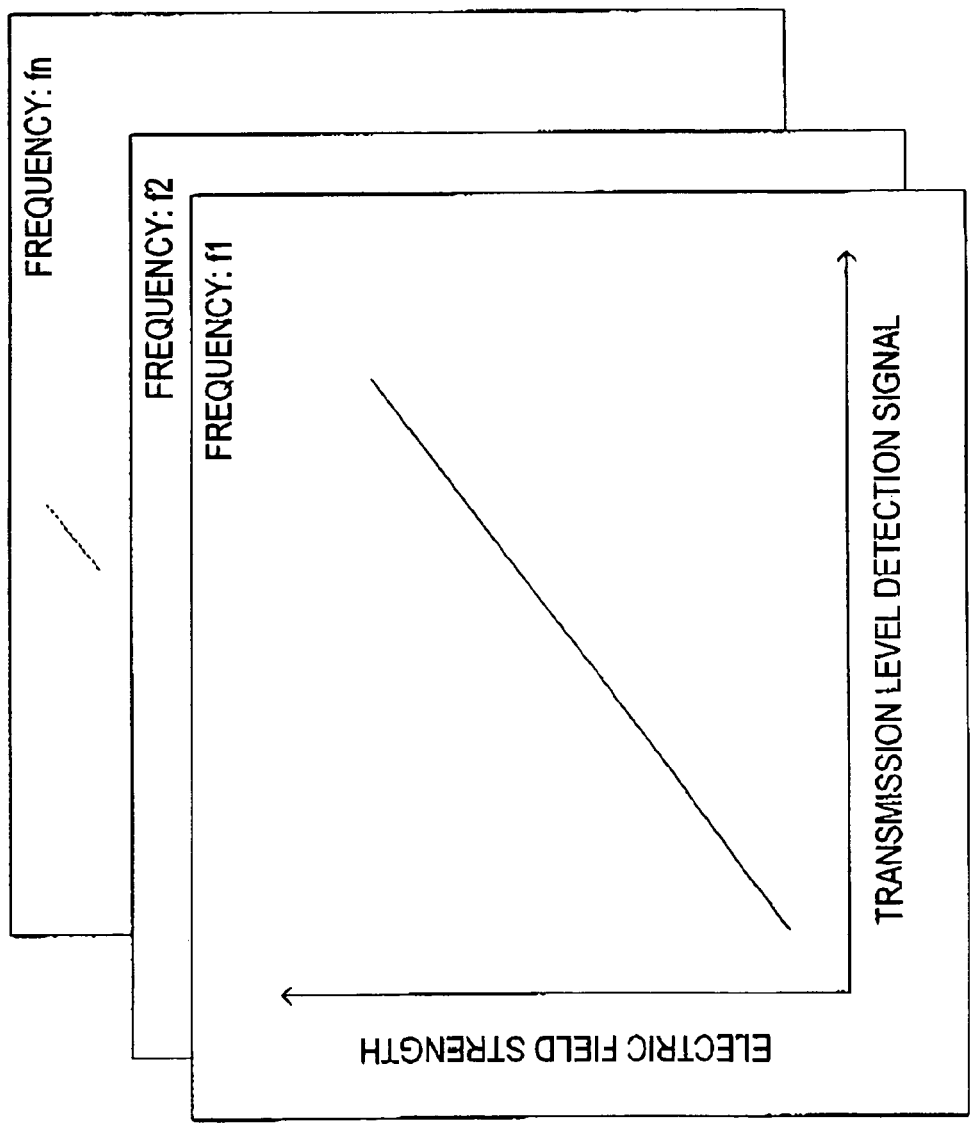
FIG. 6 is an explanatory view showing conversion data to be used to calculate an electric field strength of a test wave irradiated to test equipment from a transmission level detection signal.

In S160, an electric field strength of the test wave currently irradiated to the test equipment 4 is calculated from the received transmission level detection signal. The calculation is performed based on predetermined conversion data with respect to each of frequencies f1, f2, . . . fn, as shown in FIG. 6. The calculated electric field strength and a current test condition are stored in the storage portion 30c.

When a sequence of test operation from S130 through S160 is completed under one test condition, with a fixed frequency and a fixed polarization angle of the test wave, the present process proceeds to S170. In S170, it is determined whether or not a test operation under each of the test conditions (with the fixed frequency and a variable polarization angle which is changed to each of all polarization angles received in S100) has been completed.

When it is determined in S170 that the test operation under each of all the test conditions has not been completed, the present process returns to S120. In S120, the polarization angle of the test wave is changed to another polarization angle in accordance with another test condition, and then a sequence of test operation from S130 through S160 is again performed. Thus, a sequence of test operation from S130 through S160 with each of the polarization angles is performed.

When it is determined in S170 that the test operation under each of all the test conditions, with the fixed frequency and the variable polarization angle, has been completed, the present process proceeds to S180. In S180, it is determined whether or not a test operation from S120 through S170 under each of the test conditions, with a variable frequency which is changed to each of the frequencies received in S100, has been completed.

When it is determined in S180 that the test operation under each of all the test conditions has not been completed, the present process returns to S110. In S110, the frequency of the test wave is changed to another frequency in accordance with another test condition, and then a sequence of test operation from S120 through S170 is again performed. Thus, a sequence of test operation from S120 through S170 with each of the frequencies is performed.

When it is determined in S180 that the test operation under each of all the test conditions has been completed, the present process proceeds to S190. In S190, the electric field strength (particularly the electric field strength at a boundary point at which the test equipment 4 changes from the normal operation state to the abnormal operation state) stored with respect to each frequency and each polarization angle is read out from the storage portion 30c as a test result. The test result is displayed on a display screen of the display portion 30b along with the determination strength for determining acceptance or rejection of the test equipment 4, as illustratively shown in FIG. 7. Then, the present immunity test execution process is terminated.

Figure 7:
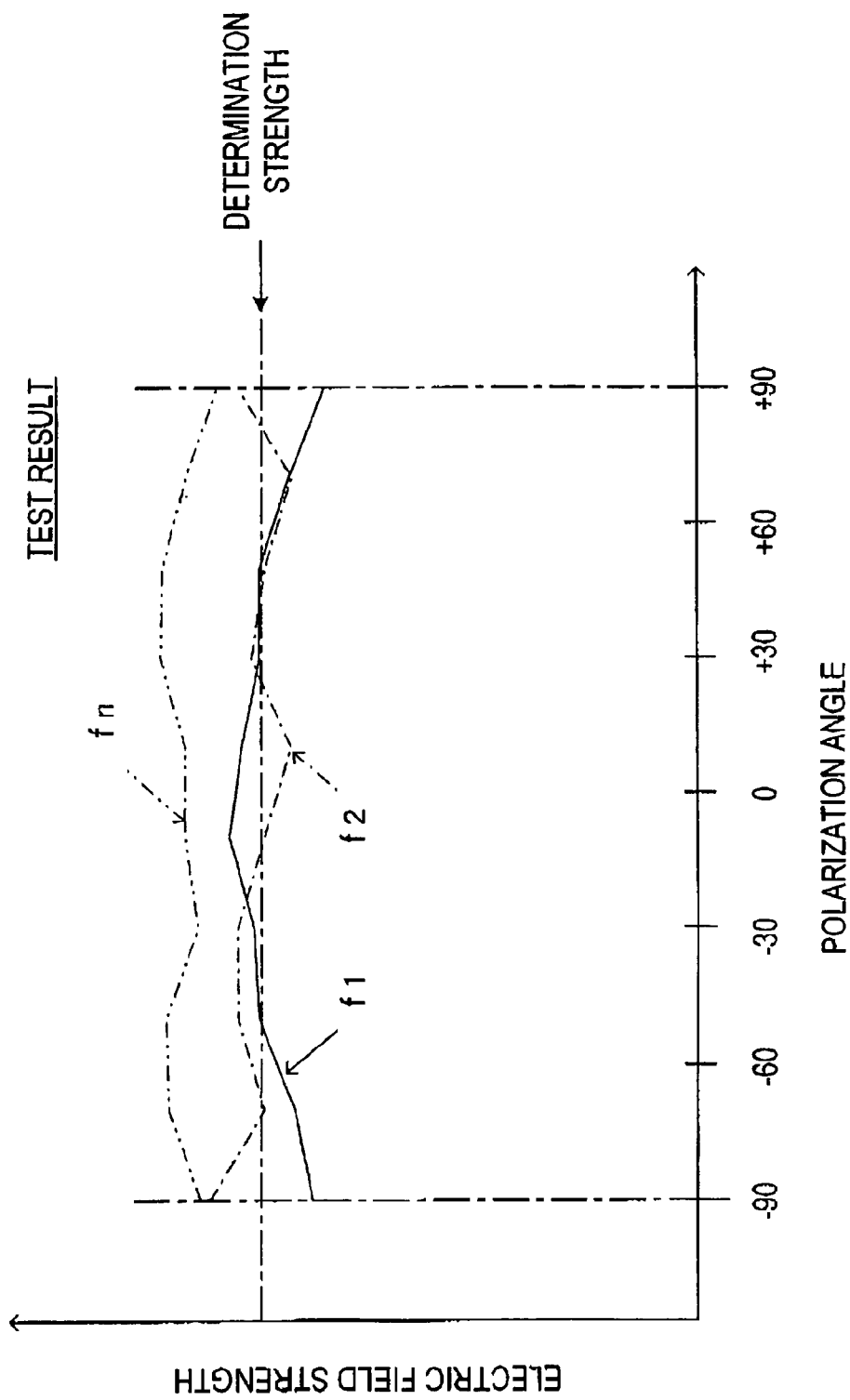
FIG. 7 is an explanatory view showing an example of test results displayed on a display portion.

The display screen of the test result in FIG. 7 shows a line graph with a vertical axis indicating the electric field strength and a horizontal axis indicating the polarization angle of the test wave. The line graph shows a relation between the electric field strength and the polarization angle at a boundary point at which the test equipment 4 starts to operate abnormally with respect to each of frequencies f1, f2, . . . fn of the test wave. The display screen of the test result need not be in a display form in FIG. 7 but may be in another form, such as a simple list or another type of graph.

In the immunity test system of the present embodiment, as described above, a plurality of frequencies and polarization angles of the test wave may be set as test conditions to be used for conducting an immunity test. Then, the frequency and the polarization angle of the test wave emitted from the horn antenna 10 toward the test equipment 4 are changed sequentially thereby to automatically conduct the immunity test.

In a conventional test system, a test wave having an electric field strength (determination strength) for determination of acceptance or rejection is irradiated to the test equipment 4 to determine whether the test equipment 4 is in a normal operation state or in an abnormal operation state.

In contrast, in the immunity test of the present embodiment, the electric field strength of the test wave irradiated to the test equipment 4 is changed to measure the electric field strength at a boundary point at which the test equipment 4 changes from a normal operation state to an abnormal operation state, and measurement results are indicated along with the determination strength in the display screen on the display portion 30b.

According to the immunity test system of the present embodiment, a user can evaluate the immunity of electronic equipment when a test wave is irradiated under specified various test conditions, based on test results shown on the display portion 30b. Since the immunity test is conducted automatically with respect to each test condition, the user may evaluate the immunity of the electronic equipment in a simple manner and in a short time. It is, therefore, possible to reduce a design time for designing electronic equipment having a sufficient immunity against interference waves and to achieve a reduced cost of the electronic equipment by using the test system of the present embodiment.

As described above, the electric field strength of the test wave irradiated to the test equipment 4 is calculated by using the signal level of the transmission signal, which is output from the amplifier 20 to the horn antenna 10, and the predetermined conversion data (see FIG. 6) with respect to each of frequencies f1, f2, . . . fn of the test wave.

The conversion data may deviate from an appropriate value not only when the arrangement of the horn antenna 10, the waveguide 12 and the placement table 6 is changed, but also when, for example, cables interconnecting components of the test system are changed. It is, therefore, preferable to predetermine the conversion data in accordance with the current test condition before placing the test equipment 4 on the placement table 6 and actually starting an immunity test.

For this purpose, the following procedure may be taken. Specifically, as indicated by a dashed line in FIG. 1, an electric field strength measuring instrument 8 is placed in the placement position of the test equipment 4 on the placement table 6. An electric field strength measured by the electric field strength measuring instrument 8 is input as an electric field strength detection signal to the determination device 30 through the E/O converter 32, the optical fiber 34 and the O/E converter 36. The determination device 30 executes a calibration process, as shown in FIG. 8, to create conversion data to be used in a subsequently conducted immunity test.

A description of the calibration process will now be provided below.

In the present calibration process, as shown in FIG. 8, a system operation check of the entire test system is first performed in S200. Specifically, control signals for operation check are provided to the motor driving device 22, the signal generator 24 and the pulse generator 26 for confirmation of the operations thereof.

In S210, it is determined whether or not the present system operates normally based on a result of the operation check.

When it is determined that the present system does not operate normally, an error message is displayed on the display portion 30b in order to make the user check interconnections and others, and the present calibration process is temporarily terminated.

When it is determined in S210 that the present system operates normally, the present process proceeds to S230. In S230, one of a plurality of frequencies, which can be set as test conditions in the present test system, is set as a frequency of a transmission signal to be generated by the signal generator 24 in accordance with a frequency control signal. Each time the process in S230 is executed, a frequency that has not yet been used since the present calibration process is started is selected from the plurality of frequencies, which can be set as test conditions, and is set as the frequency of the transmission signal.

In S240, the frequency control signal and a level control signal are provided to the signal generator 24 to activate the signal generator 24 so as to output a transmission signal from the signal generator 24. Also, a signal output level from the signal generator 24 is gradually increased within a predetermined range by changing the level control signal.

In S250, sampling of the electric field strength detection signal input through the O/E converter 36 and the transmission level detection signal from the amplifier 20 is performed repeatedly while the signal level of the test wave transmitted from the horn antenna 10 is changed as a result of the process in S240. When the sampling of the electric field strength detection signal and the transmission level detection signal in S250 is completed, the present process proceeds to S260.

In S260, conversion data as shown in FIG. 6 is created based on a result of the sampling and is stored in the storage portion 30c. When conversion data is created with respect to one of the plurality of frequencies, which can be set as test conditions in the present test system, the present process proceeds to S270.

In S270, it is determined whether or not creation of conversion data with respect to each of all the frequencies, which can be set as test conditions in the present test system, has been completed.

When it is determined that creation of conversion data with respect to each of all the frequencies has not been completed, the present process returns to S230. The frequency of the transmission signal generated by the signal generator 24 is changed in S230, and then the processings from S240 through S260 are again executed. Thus, conversion data with respect to the changed frequency is created.

On the other hand, when it is determined that creation of conversion data with respect to each of all the frequencies has been completed, the present calibration process is terminated.

The creation of conversion data by the determination device 30 executing the above calibration process before conducting an immunity test will lead to more accurate measurement of an electric field strength of an interference wave at a boundary point at which the test equipment 4 changes from the normal operation state to the abnormal operation state by using the conversion data during the immunity test.

In the above embodiment, the probe P1 for emitting the test wave provided to the horn antenna 10 is rotated by using the motor 18 in order to continuously change the test wave, which is to be emitted from the horn antenna 10 toward the test equipment 4, from a vertically polarized wave to a horizontally polarized wave, or vice versa. However, the polarization angle of the test wave may be changed in another manner.

Figure 9A:
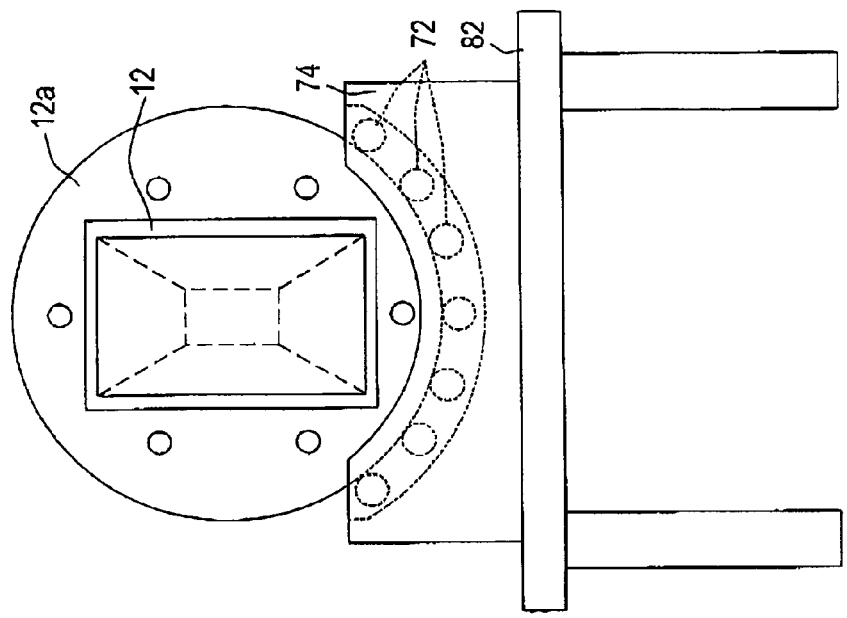
FIGS. 9A and 9B are explanatory views showing an alternative configuration of a mechanism to control a polarization angle of a test wave.
Figure 9B:
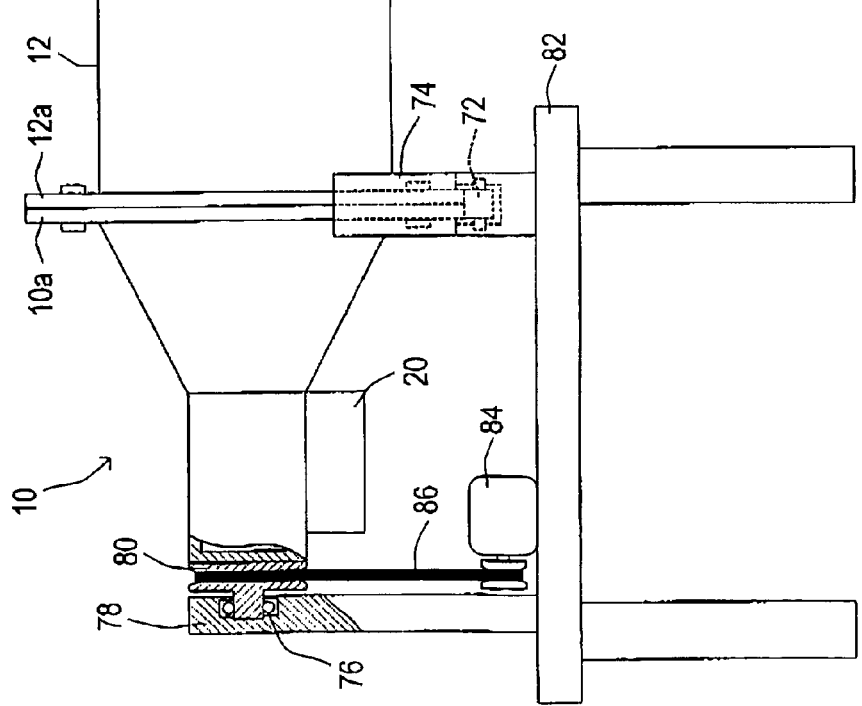

Such an example is shown in FIGS. 9A and 9B. A disk-like flange 10a is formed at an open end of the horn antenna 10, while a disk-like flange 12a is formed at an open end of the waveguide 12 on a side of the horn antenna 10. The horn antenna 10 and the waveguide 12 are combined by connecting these flanges 10a and 12a with bolts or the like. By rotating the combined horn antenna 10 and the waveguide 12 around a central axis thereof, the polarization angle of the test wave can be changed.

More specifically, FIG. 9A is a front elevational view of the combined horn antenna 10 and the waveguide 12 seen from a side direction, and FIG. 9B is a side elevational view of the combined horn antenna 10 and the waveguide 12 seen from the open end side of the waveguide 12. As shown in FIGS. 9A and 9B, a circumference of a connected portion of the flange 10a of the horn antenna 10 and the flange 12a of the waveguide 12 is supported in a rotatable manner around a central axis of the horn antenna 10 by a first supporting portion 74 provided with a plurality of rollers 72. Also, a projection provided at a rear end of the horn antenna 10 is supported in a rotatable manner around the central axis of the horn antenna 10 through a second supporting portion 78 provided with shaft bearing members 76, such as ball bearings or the like. Accordingly, the combined horn antenna 10 and the waveguide 12 can be supported in a rotatable manner around the central axis thereof, and thereby the polarization angle of the test wave can be changed.

In this case, a pulley 80 may be provided at a rear end of the horn antenna 10, and the pulley 80 and a rotating shaft of the motor 84, which is fixed on a table 82 to which the first and second supporting portions 74 and 78 are assembled, may be connected with a belt 86, as shown in FIG. 9A. This enables automatic control of the polarization angle in the same manner as in the above described embodiment.

What is claimed is:

1. An immunity test system for determining an immunity of a piece of electronic equipment as a test object by irradiating the electronic equipment with a test wave, the immunity test system comprising:
    an antenna that emits the test wave toward the electronic equipment;
    a signal generator having a first amplifier, and the signal generator generating a transmission signal through the first amplifier to cause the antenna to emit the test wave;
    a level adjusting device that adjusts a signal level of the transmission signal inputted from the signal generator to the antenna by controlling a gain of the first amplifier;
    a boundary point detection device that chances the signal level of the transmission signal inputted to the antenna through the level adjusting device while monitoring operation of the electronic equipment, and thereby detects a signal level of the transmission signal at a boundary point at which the electronic equipment is changed, due to the test wave, from a normal operation state to an abnormal operation state or from an abnormal operation state to a normal operation state; and
    a test result storing device that calculates an electric field strength of the test wave irradiated to the electronic equipment, at the boundary point, by using a predetermined conversion data based on the signal level of the transmission signal at the boundary point detected by the boundary point detection device, and stores a calculation result of the electric field strength as well as a test condition used for obtaining the electric field strength in a storage device, thereby allowing an evaluation of the immunity of the electronic equipment;
    wherein the antenna is a horn antenna, and one end of the horn antenna is connected to a first waveguide having a rectangular shape cross-section;
    the test wave is emitted from the first waveguide toward the electronic equipment;
    a second waveguide is connected to the other end of the horn antenna;
    a first probe is arranged within the second waveguide and is provided with the transmission signal for emitting the test wave;
    a second probe for feeding the transmission signal to the first probe; and
    a third waveguide for forming a power feed path for the transmission signal from the second probe to the first probe.

2. The immunity test system according to claim 1, further comprising a test condition changing device,
    wherein the signal generator is adapted such that the frequency of the transmission signal is capable of being set from an outside source,
    a plurality of test conditions are set such that at least one of the plurality of test conditions includes a frequency which is different from a frequency included in another at least one of the plurality of test conditions, and
    the test condition changing device sets the frequency of the transmission signal, generated by the signal generator, to the frequency included in the at least one of the plurality of test conditions and changes the frequency of the transmission signal generated by the signal generator to the frequency included in the another at least one of the plurality of test conditions when a sequence of test operations, performed by the boundary point detection device and the test result storing device under the at least one of the plurality of test conditions, is completed, thereby to allow execution of the sequence of test operations with respect to each of the frequencies to be included in the plurality of test conditions.

3. The immunity test system according to claim 1,
    wherein a plurality of test conditions are set such that at least one of the plurality of test conditions includes a polarization angle which is different from a polarization angle included in another at least one of the plurality of test conditions,
    the immunity test system further comprises:
    a polarization plane adjusting device that changes the polarization angle of the test wave emitted from the antenna at least between a horizontal direction and a vertical direction; and
    a test condition changing device that sets the polarization angle of the test wave emitted by the antenna through the polarization plane adjusting device to the polarization angle included in the at least one of the plurality of test conditions and changes the polarization angle of the test wave emitted by the antenna to the polarization angle included in the another at least one of the plurality of test conditions when a sequence of test operations, performed by the boundary point detection device and the test result storing device under the at least one of the plurality of test conditions, is completed, thereby to allow execution of the sequence of test operations with respect to each polarization angle set to be included in the plurality of test conditions.

4. The immunity test system according to claim 1, further comprising a display device that displays a test result stored in the storage device by the test result storing device.

5. The immunity test system according to claim 1, further comprising a test condition input device for registering at least one test condition from an outside source.

6. The immunity test system according to claim 1, it further comprising:
    a device that creates conversion data to be used by the test result storing device for calculating an electric field strength of a test wave before determining the immunity of the electronic equipment, the device including:
    an electric field strength measuring device disposed at a placement position, at which the electronic equipment as an object of determining the immunity thereof is placed, to measure an electric field strength of the test wave emitted from the antenna; and
    a conversion data creation device that reads the electric field strength of the test wave obtained through the electric field strength measuring device while changing the signal level of the transmission signal inputted to the antenna through the level adjusting device, thereby to create data indicating a correspondence between the signal level inputted to the antenna and the electric field strength of the test wave at the placement position of the electronic equipment and sets the created data as the conversion data.

7. The immunity test system according to claim 1, further comprising:

a second amplifier that amplifies the transmission signal inputted from the signal generator to the antenna; and a suppressing device that suppresses an amplifying operation of the second amplifier when a signal level of portions of a received signal, inputted from the antenna to the second amplifier, is higher than a predetermined maximum level.

* * * * *